United States Patent

Stelloh et al.

[11] Patent Number: 5,144,246
[45] Date of Patent: Sep. 1, 1992

[54] VACUUM TUBE CHARACTERIZATION APPARATUS

[75] Inventors: Frank A. Stelloh, Brookfield; Gregory J. Derzay, Milwaukee, both of Wis.

[73] Assignee: General Electric Company, Milwaukee, Wis.

[21] Appl. No.: 703,066

[22] Filed: May 20, 1991

[51] Int. Cl.5 .......................................... G01R 31/00
[52] U.S. Cl. ................................................. 324/405
[58] Field of Search ........................................ 324/405

[56] References Cited

U.S. PATENT DOCUMENTS

| | | | |
|---|---|---|---|
| 2,616,058 | 10/1952 | Wagner | 324/412 |
| 3,110,859 | 11/1963 | Otto | 324/405 |
| 3,230,417 | 1/1966 | Taylor | 324/405 |
| 4,504,783 | 12/1985 | Zasio et al. | 324/158 F |

Primary Examiner—Kenneth A. Wieder
Assistant Examiner—Maura K. Regan
Attorney, Agent, or Firm—Quarles & Brady

[57] ABSTRACT

An apparatus measures the operational parameters of a vacuum tube that has an anode, a cathode, a grid and a filament. A source of a bias potential for the anode is included along with a generator that produces a series of pulse at each of a plurality of voltage levels. A resistor couples the pulses to the vacuum tube grid and another resistor couples the cathode to ground potential. A voltmeter sequentially measures the voltages on the grid, the anode, the cathode, and across the resistors. From these voltage measurements, the system computes the levels of the grid current and the filament current. These parameters of the tube are displayed graphically for use in comparing the performance of different tubes.

16 Claims, 3 Drawing Sheets

VACUUM TUBE CHARACTERIZATION APPARATUS

BACKGROUND OF THE INVENTION

The present invention relates to equipment for measuring the electrical characteristics of vacuum tubes.

A common type of radio frequency amplifier has an output stage with two triode vacuum tubes connected in parallel. Each of these tubes is capable of handling several kilowatts of power. In the parallel arrangement, it is important that the tubes have as closely matched performance characteristics as possible.

A standard technique for characterizing vacuum tubes is known as single point static characterization in which the parameters of the tube are measured during operation at a constant relatively low power level. This technique measures the grid current, anode current, anode to cathode voltage, and grid to cathode voltage as indicating the performance of the tube. After measuring the characteristics of a number of tubes, the tubes are grouped in pairs with closely matching parameters.

Utilizing a single operating point to measure the tube parameters does not provide a good indication of the overall tube performance throughout its entire dynamic operating range. For example, the performance of a pair of tubes matched in this manner can differ significantly at higher power levels, so as to adversely affect a signal being amplified in critical applications, such as magnetic resonance imaging equipment Therefore, it is desirable to measure the performance of the vacuum tube throughout its entire dynamic operating range. However conventional test equipment apply excitation potentials to the tube for relatively long intervals in order to measure the operating parameters. Although tubes are able to tolerate lengthy excitation at low power levels, they often can not withstand continuous high power operation for the required measurement interval. Thus conventional methods for characterizing vacuum tube performance can not measure the operational parameters at high power levels.

SUMMARY OF THE INVENTION

An apparatus characterizes a vacuum tube by measuring a set of operational parameters of the tube. The apparatus includes a power supply to bias the anode and the cathode of the vacuum tube, and a generator which applies series of pulses at a specified voltage level to the vacuum tube grid. A mechanism is provided to change the specified voltage level within a range of values for a particular vacuum tube being tested.

A circuit is incorporated into the apparatus to measure a plurality of operational parameters of the vacuum tube during a series of pulses at each specified voltage level. For example, the parameters being measured include grid voltage, anode voltage, cathode current, and filament current. In the preferred embodiment, the measurement circuit has a current sensing resistor through which the pulses flow to the grid, another resistor couples the cathode to ground potential to provide a cathode current indication. The filament current flows through still another resistor A meter senses the voltage drop across each of these resistors to provide an indication of the level of current flowing through them. The grid, anode, filament and high voltage power supply potentials also are measured by the meter.

An object of the present invention is to have a system that provides data which allows vacuum tubes to be matched in performance more accurately than with single point characterization methods.

Another object is to provide an apparatus for measuring vacuum tube performance characteristics throughout the full dynamic range of operation, especially at high power levels of operation.

DESCRIPTION OF THE PRESENT INVENTION

Figure 1:
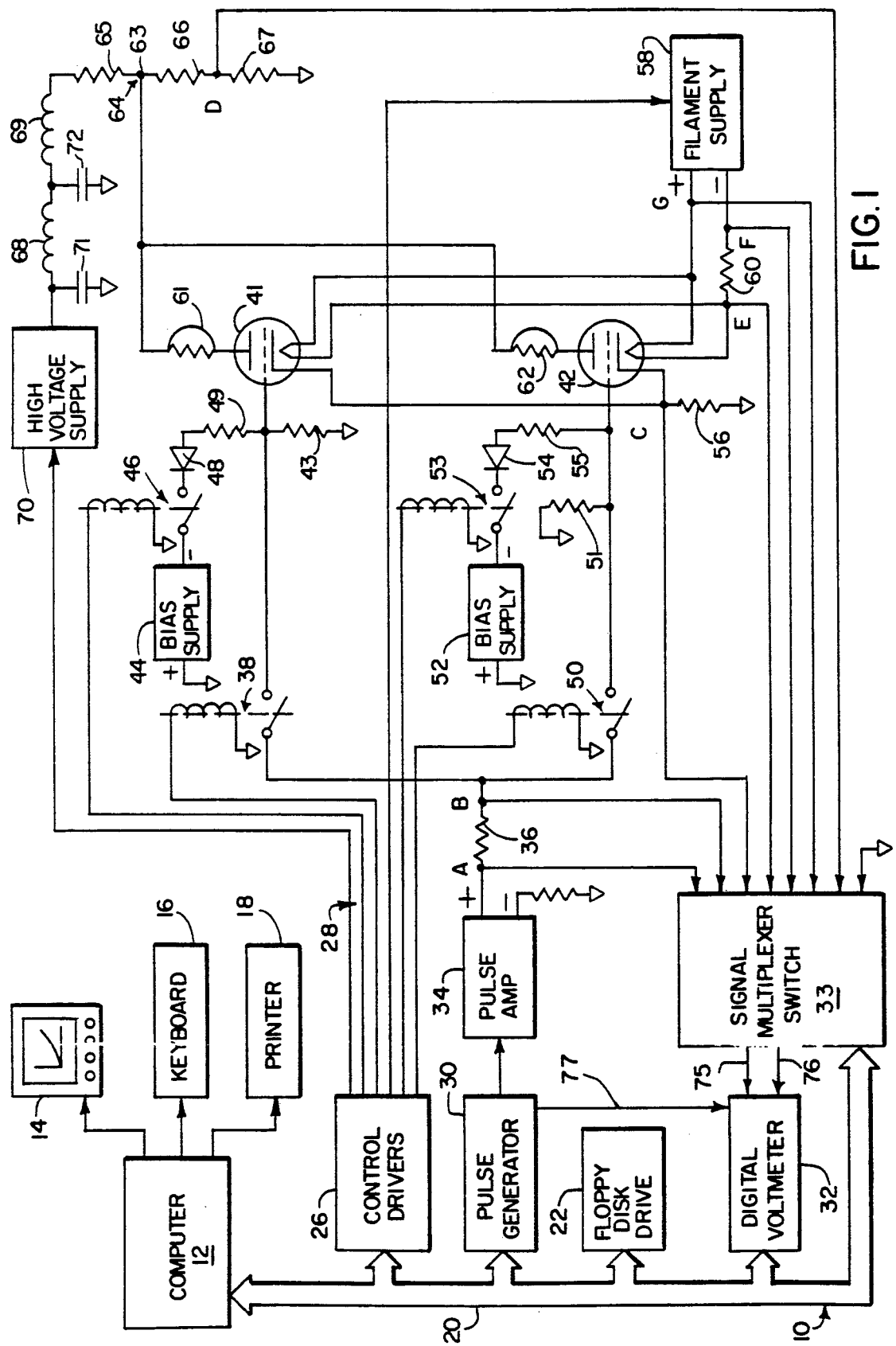
FIG. 1 is a block schematic diagram of a vacuum tube characterization system according to the present invention.

With initial reference to FIG. 1, a vacuum tube characterization system 10 includes a programmable computer 12 to which a monitor 14, a keyboard 16 and a printer 18 are connected. The computer 12 also is coupled to a signal bus 20, such as a standard IEEE 488 bus, which comprises sets of address, data and control conductors. A floppy disk drive 22 is connected to the bus 20 for the archival storage of data and programs for computer 12. Also coupled to the bus 20 are a set of individually addressable control drivers 26, as embodied in a switch control unit such as a Hewlett-Packard model 3488A. Each control driver governs the application of current to a different control line in set 28. A digitally controlled pulse generator 30, such as a Wavetek model 278, and a digital voltmeter 32, such as a Hewlett-Packard model 3457A, are connected to the signal bus 20. Signals on the bus 20 also control a signal multiplexer (MUX) switch 33 which also is part of a Hewlett-Packard model 3488A, for example.

The output signal from the pulse generator 30 is applied to the input of a pulse amplifier 34 having an output connected to node A. A relatively low value (e.g. 10 ohms) current sensing resistor 36 connects node A to node B, which in turn is coupled via normally-open contacts of a first relay 38 to the grid of a first vacuum tube 41 to be characterized. The grid of the first vacuum tube 41 is coupled to ground by a resistor 43. A first bias supply 44 provides a negative voltage potential sufficient to drive the grid of the vacuum tube 41 into cutoff. This negative voltage is applied via normally-open contacts of a second relay 46, diode 48 and a resistor 49 to the grid of the first vacuum tube 41.

A second vacuum tube 42 to be characterized is connected to the system 10 in a similar manner as the first vacuum tube 41. Specifically, node B is coupled via the normally-open contacts of a third relay 50 to the grid of the second vacuum tube 42. The second vacuum tube grid also is connected to ground by resistor 51, and to a second bias supply 52 via normally-open contacts of a fourth relay 53, diode 54 and resistor 55.

The cathodes of both vacuum tubes 41 and 42 are connected together at node C which is coupled to ground by a very low value (e.g. 0.1 ohms) current sensing resistor 56. Each of the vacuum tubes 41 and 42 has a filament, one end of which is connected directly to a filament supply 58 at node G, and the other end of which is coupled via a current sensing resistor 60 to the filament supply. The ends of the filament supply resistor 60 form nodes E and F. Anodes of the two vacuum tubes 41 and 42 are connected by separate parasitic suppression networks 61 and 62 to an intermediate node 63 of a voltage divider 64 comprising resistors 65, 66 and 67 connected in series. Resistor 65 (typically 250 ohms) provides a power load to the tube being tested. Another intermediate node of the voltage divider 64 is designated node D. One end of the voltage divider 64 is connected to ground, while the other end is coupled by a pair of serially connected chokes 68 and 69 to a high voltage supply 70. The ends of choke 68 are coupled to ground by capacitors 71 and 72 to form a low-pass filter.

The high voltage supply 70 responds to a signal from one of the control drivers 26 by applying a high positive bias potential to the anodes of both vacuum tubes 41 and 42. The coils of the four relays 38, 46, 50 and 53 are energized by different signals sent over the set of lines 28 from other control drivers 26.

Nodes A-G are connected to inputs of the signal multiplexer switch 33. The signal multiplexer switch 33 responds to control signals received over bus 20 from the computer 12 by connecting a pair of inputs to the digital voltmeter 32. When the voltage at a single node is to be measured, the signal multiplexer switch 33 connects that node to one input line 75 of the voltmeter 32 and grounds the other input line 76. At other times the voltage across a current sensing resistor can be measured by the signal multiplexer switch 33 connecting the nodes on either side of the resistor to the input lines 75 and 76. For example, the grid current is measured by simultaneously connecting nodes A and B to the digital voltmeter 32.

The present characterization system 10 is capable of testing two separate vacuum tubes 41 and 42 during each operating cycle. Prior to performing that testing, the respective vacuum tubes are connected to the circuitry as shown in FIG. 1. This can be easily accomplished using standard tube sockets, rather than direct connections to the vacuum tubes. Once the tubes have been connected and properly shielded, the operator enters a command into the keyboard 16 which causes the computer 12 to commence a software routine for examining each of the tubes.

Figure 2:
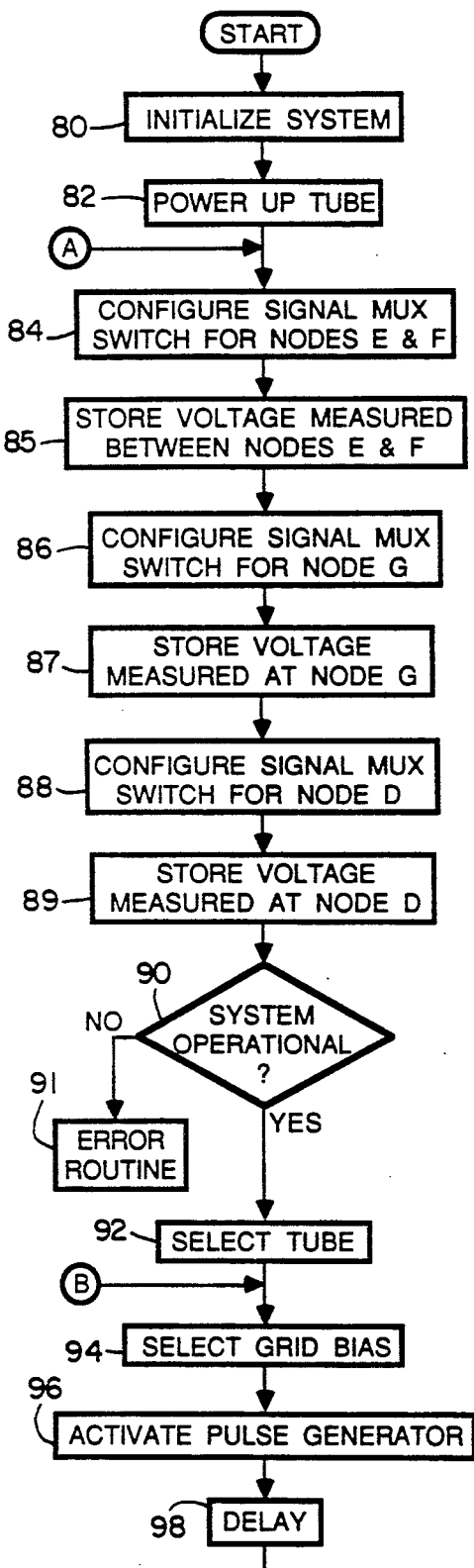
FIG. 2 represents a flowchart of the software for operating the system of FIG. 1 to test vacuum tubes.
Figure 2:
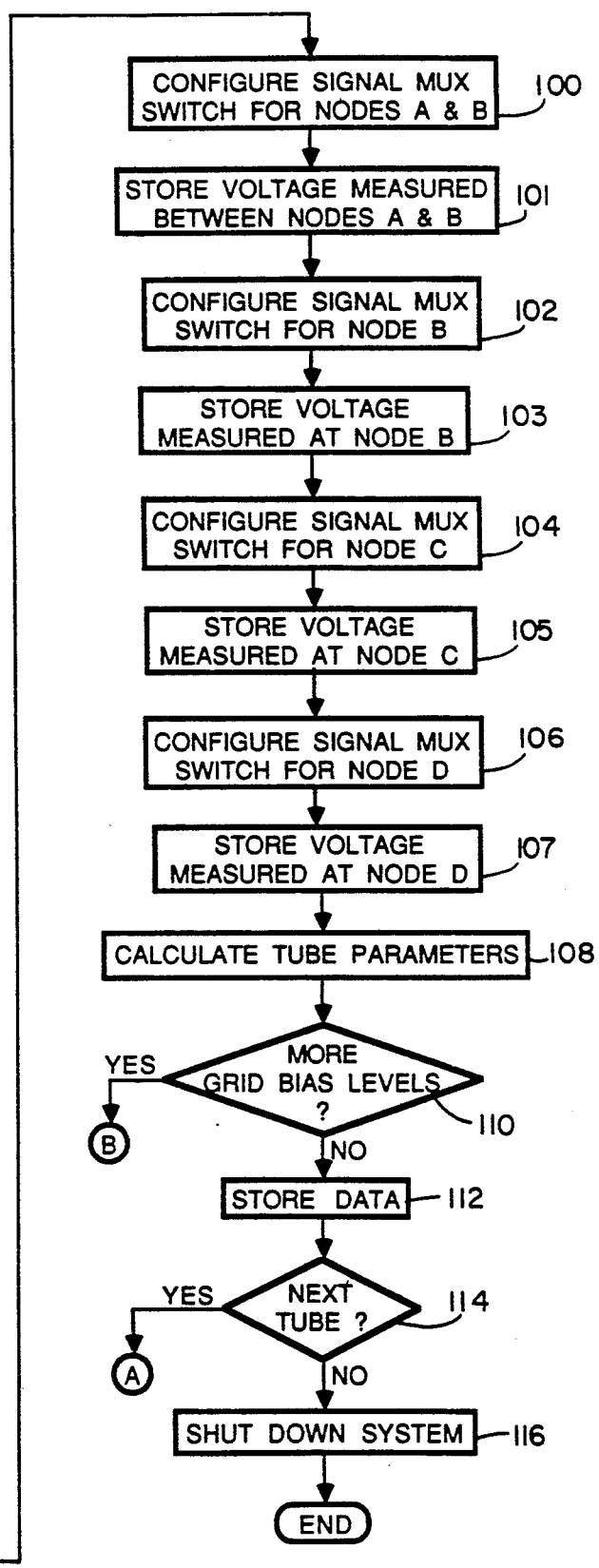

With reference to FIG. 2, the software routine begins by initializing the system at step 80 where variables and counters are reset to their starting values, and by performing at step 82 a power-up sequence specified by the tube manufacturer. During the power-up sequence the computer 12 initially sends a command to one of the control drivers 26 to turn on the filament supply 58 to heat the vacuum tubes 41 and 42 to their operating temperature. After waiting a sufficient period for the tube heating, the computer sends a command to other control drivers 26 to close relays 46 and 53 thereby applying a cutoff bias to the tube grids. Another command activates the high voltage supply 70 to apply the anode bias potential to both vacuum tubes 41 and 42.

The program execution advances to step 84 where the computer instructs the signal multiplexer (MUX) switch 33 to couple the input lines from nodes E and F to the digital voltmeter 32. Once the connection has been established, the digital voltmeter measures the voltage between those nodes, which represents the voltage drop across the filament current sensing resistor 60. The value of this voltage measurement is digitized and latched in the voltmeter 32. The computer then reads this latched data from the digital voltmeter 32 and stores the voltage value in its memory, at step 85.

Another command is sent to the signal multiplexer switch 33 at step 86 causing the switch to couple the grounded input line and the input line from node G to the digital voltmeter 32. This connection enables the measurement of the filament supply voltage which is read and stored by the computer 12 at step 87. Thereafter at steps 88 and 89, the voltage at node D, which corresponds to the anode bias potential, is measured and stored in a similar manner.

Before the tube testing progresses further, a determination is made at step 90 whether the characterization system 10 is in an operational state. Specifically the value of the voltage measured at node D is compared to a reference value to determine if the proper anode bias potential is being applied to the tubes 41 and 42. Other checks are performed of interlock switches to insure that safety shields are in place. If something is amiss, the program branches to an error routine at step 91, which sends a message to the operator before terminating the testing procedure.

If the system 10 is operating satisfactorily the program execution advances to step 92. At this juncture, one of the tubes 41 or 42 is selected for testing by the computer 12 sending a command to the appropriate control driver in set 26 that operates relay 38 or 50 associated with the tube to be tested. To select the first vacuum tube 41, the coil of the first relay 38 is energized to close its contacts, thereby coupling node B to the grid of that tube. The testing is performed by sequentially applying pulses of different bias voltages to the grid of the first vacuum tube 41 and measuring tube parameters during the pulses. For example, to test an Eimac Corp. model 8877 vacuum tube, the range of grid voltages extends from −24 volts to +115 volts, which encompasses the dynamic range in which the tube will be operated when it is incorporated into an amplifier. Twenty eight different bias levels in five volt increments throughout this range are sequentially utilized to test the tube.

The initial bias level is selected at step 94 and the appropriate digital command is sent by the computer over bus 20 to the pulse generator 30. The pulse generator responds at step 96 by producing a rectangular output pulse having an amplitude that produces the appropriate bias voltage level at the output of pulse amplifier 34. Each pulse from the generator and amplifier is three milliseconds in duration with a four percent duty cycle. Computer 12 then sends a signal to one of the control drivers 26 to open the contacts of the second relay 46 to disconnect the first bias supply 44 from the tube. The pulse generator 30 and pulse amplifier 34 provide a grid excitation signal which is referenced to the cutoff voltage, thereby replacing the fixed bias supply 44 while the tube 41 is under test.

Each time a pulse is produced by generator 30, the digital voltmeter 32 is triggered by a signal on line 77. The voltmeter responds by measuring the level of the voltage applied to its input via the signal multiplexer switch 33. By taking voltage measurements during brief grid pulses having small duty cycles, tube performance can be measured throughout the full dynamic range of operation without subjecting the tube to excessive average power levels for unreasonably long periods At step 98, the computer 12 then waits for a fixed period of time while the grid pulses are being applied so that the vacuum tube under test can stabilize. After the delay, the program advances to step 100 where the computer instructs the signal multiplexer (MUX) switch 33 to couple the input lines from nodes A and B to the digital voltmeter 32. The next pulse produced by the pulse generator 30 causes the digital voltmeter to measure the voltage between those nodes, which represents the voltage drop across the grid current sensing resistor 36. The value of this voltage measurement is digitized and latched in the voltmeter 32. Before another grid pulse occurs, the computer 12 then reads this latched data from the digital voltmeter 32 and stores the voltage value in its memory, at step 101.

The computer 12 then configures the signal multiplexer switch 33 to couple node B to the digital voltmeter at step 102. During the next pulse from the pulse generator 30, the voltage at node B is measured by the voltmeter 32 and then stored by computer 12 at step 103 of the control program. Sequentially, similar operations are performed at steps 104–107 to measure the voltage at circuit nodes C and D during subsequent pulses of the first selected grid bias voltage. Each of these voltage measurements is stored temporarily in the computer's memory.

The execution of the measurement program advances to step 108 where the measured voltages are translated into tube parameters. The anode voltage is measured by sensing the lower voltage at node D of the voltage divider 64, whereas the anode is biased from node 63. The computer 12 derives the actual anode bias voltage from the voltage at node D and the values of voltage divider resistors 66–67. The computer also calculates the grid current using the voltage drop across resistor 36. Similarly, the filament current can be calculated from the voltage drop across resistor 60. The total cathode current is derived by the computer 12 from the voltage at node C and the value of resistor 56. At this point, the computer knows the value of the grid to cathode current and the total cathode current, thereby being able to mathematically compute the anode current.

At step 110, if measurements remain to be made at other grid bias levels, the program execution returns to step 94 where a new grid bias level is selected and sent to the pulse generator 30. Thereafter, another set of voltage measurements is performed and tube parameters calculated. Once measurements have been made at all of the desired grid bias voltages, the program execution advances to step 112 where the measurements are stored to the floppy disk 22 as a series of data arrays.

The computer 12 then determines at step 114 whether both of the vacuum tubes 41 and 42 have been tested. If another vacuum tube remains to be tested, the program execution returns to step 84 to select that tube. For example at the completion of testing the first vacuum tube 41, the first relay 38 is deenergized to open its contacts 38 and simultaneously the second relay 46 is energized to apply the cutoff bias from supply 44 to the grid of tube 41. Thereafter, the third relay 50 is energized, by addressing the appropriate control driver within set 26, to close the set of contacts coupling the output of the pulse amplifier 34 to the grid of vacuum tube 42. Then a similar command is sent to a control driver to open contacts of the fourth relay 53, and disconnect the second bias supply 52 from the grid of the second tube 42.

If both of the tubes have been tested when the program reaches step 114, the program execution advances to step 116 where the computer 12 performs an orderly shutdown of the biasing applied to the tubes 41 and 42. This shutdown sequentially opens the control relays, deactivates the high voltage and filament power supplies, monitors the anode bias supply voltage decay and continues to operate blowers for cooling the tube.

After all of the measurements have been taken for the two tubes, the results can be printed on printer 18. The voltage measurements and currents for each grid bias level can be printed in tabular form. Alternatively, conventional software techniques can be used to graphically plot the results of the tube characterization process, as shown in the three graphs in FIGS. 3 through 5. The graphical depiction is preferred for identifying pairs of vacuum tubes with matching parameters.

Figure 3:
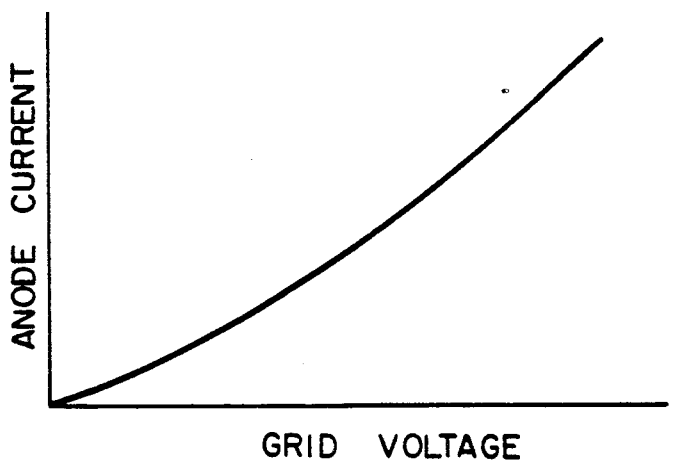
FIG. 3 is graph of the plate current versus grid voltage of an exemplary vacuum tube.
Figure 4:
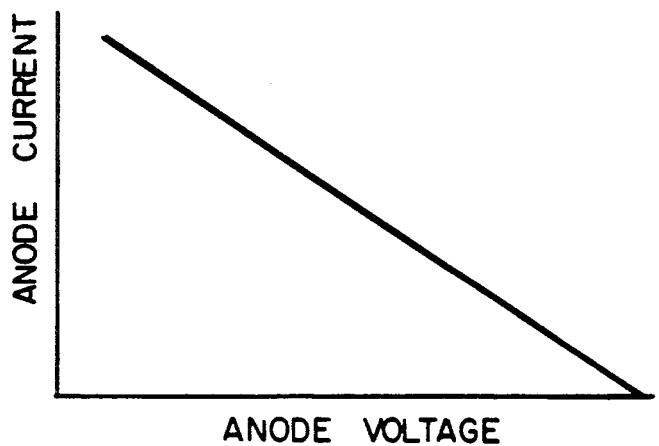
FIG. 4 graphically depicts the plate current versus plate voltage the exemplary vacuum tube.
Figure 5:
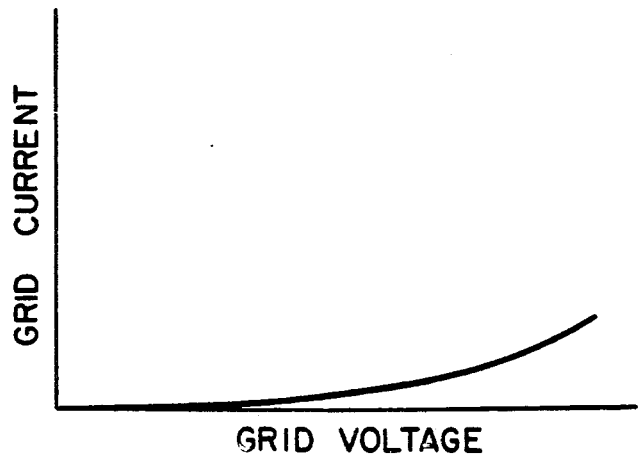
FIG. 5 is a graph plotting the grid current versus grid voltage for the exemplary vacuum tube

The first graph is a plot of the plate current versus grid voltage in FIG. 3, while FIG. 4 shows the plate current versus plate voltage characteristic. FIG. 5 illustrates the grid current versus the grid voltage. Each graph represents a tube parameter throughout the full dynamic range in which the tube will be operated and thus more accurately portray the tube characteristics than single operating point data. Sets of graphs for many tubes can be visually compared to determine pairs of tubes with closely matching characteristics. These matched paris of tubes can be used in the same radio frequency power amplifier to produce an optimum response from that amplifier.

Because the measurements are made during short bursts of tube excitation, the vacuum tube parameters can be measured non-destructively throughout their full operational range of values. The use of a computer to control the characterization process enables measurements to be taken during such short bursts and contributes to a high degree of measurement precision.

We claim:

1. An apparatus for characterizing a vacuum tube that has an anode, a cathode and a grid comprising:
   means for applying a bias potential across the anode and the cathode of the vacuum tube;
   means for specifying a plurality of grid voltages;
   means for generating a series of consecutive pulses at each of the specified grid voltages and for coupling the pulses to the grid of the vacuum tube; and
   means for measuring a plurality of operational parameters of the vacuum tube by automatically measuring a different one of the parameters during different pulses of each series.

2. The apparatus for characterizing a vacuum tube as recited in claim 1 wherein the operational parameters of the vacuum tube measured during each series comprise anode voltage, grid voltage, anode current, and grid current.

3. The apparatus for characterizing a vacuum tube as recited in claim 2 wherein the vacuum tube also has a filament; and the group of operational parameters further comprises filament current.

4. The apparatus for characterizing a vacuum tube as recited in claim 1 wherein when the vacuum tube is used in electronic equipment a range of grid voltages is applied to the tube; and said means for specifying designates grid voltage levels substantially throughout the range.

5. An apparatus for measuring operational parameters of a vacuum tube that has an anode, a cathode, a grid and a filament; the apparatus comprising:
   means for applying a bias potential to the anode of the vacuum tube;

a first resistor for coupling the cathode of the vacuum tube to a fixed potential;

means for specifying a number of grid voltage levels;

means for generating a plurality of pulses at each of the specified grid voltage levels;

a second resistor having two terminals for coupling the series of pulses from said means for generating to the grid of the vacuum tube;

a voltmeter having an input to which a voltage to be measured is applied; and means for selectively coupling the input of said voltmeter to each terminal of said second resistor, the grid, the anode, and the cathode.

6. The apparatus for measuring as recited in claim 5 further comprising means for calculating grid current magnitude and anode current magnitude from voltage measurements performed by said voltmeter.

7. The apparatus for measuring as recited in claim 5 further comprising a source of filament current, and a third resistor having two terminals for coupling said source of filament current to the filament; and wherein said means for selectively coupling also can separately couple the input of said voltmeter to each terminal of said third resistor.

8. The apparatus for measuring as recited in claim 7 further comprising means for calculating a filament current magnitude from voltage measurements performed by said voltmeter.

9. The apparatus for measuring as recited in claim 5 further comprising a bias supply for selectively applying a cutoff potential to the grid of the vacuum tube.

10. A system for determining operating parameters of a vacuum tube that has an anode, a cathode and a grid; the system comprising:

a programmable computer including a bus which carries data and control signals;

means for applying a bias potential to the anode of the vacuum tube;

a pulse generator connected to the bus for generating a plurality of pulses at each of a number of voltage levels defined by signals from said computer, the pulses being applied to the grid of the vacuum tube; and means for sensing a magnitude of current flowing from said pulse generator to the grid, a magnitude of current flowing through the cathode, a voltage of the anode and a voltage of the cathode, wherein the sensing occurs during the plurality of pulses.

11. The system as recited in claim 10 further comprising a bias supply to selectively apply a cutoff potential to the grid of the vacuum tube.

12. The system as recited in claim 10 wherein said means for sensing comprises:

a first resistor for coupling the cathode to ground potential;

a second resistor, having two terminals, for coupling the series of pulses from said pulse generator to the grid of the vacuum tube;

a digital voltmeter having an input to which a voltage to be measured is applied and an output connected to the bus; and means for selectively connecting the input of said digital voltmeter to the gird, the cathode, the anode and each terminal of said second resistor.

13. The system as recited in claim 10 wherein the vacuum tube also has a filament, and wherein said means for sensing also senses a level of current flowing through the filament.

14. The system as recited in claim 13 wherein said means for sensing comprises:

a first resistor for connecting the cathode to ground potential;

a second resistor, having two terminals, for coupling the series of pulses from said pulse generator to the grid of the vacuum tube;

a third resistor, having two terminals, for connection in series with the filament;

a digital voltmeter having an input to which a voltage to be measured is applied and an output connected to the bus; and means for selectively coupling the input of said digital voltmeter to the grid, the cathode, the anode, each terminal of said second resistor, and each terminal of said third resistor.

15. The apparatus as recited in claim 1 wherein said means for measuring comprises:

a device which measures an electrical characteristic and which has an input; and means for successively coupling the input of said means for measuring to the anode, the cathode, and the grid of the vacuum tube during different pulses of each series.

16. The apparatus as recited in claim 15 further comprising means for calculating an operational parameter of the vacuum tube from a measurement of an electrical characteristic performed by said device.

* * * * *